(12) United States Patent
Ding et al.

(10) Patent No.: US 8,987,101 B2
(45) Date of Patent: Mar. 24, 2015

(54) METHOD OF FORMING STRAINED SOURCE AND DRAIN REGIONS IN A P-TYPE FINFET STRUCTURE

(71) Applicant: Shanghai Huali Microelectronics Corporation, Shanghai (CN)

(72) Inventors: Yi Ding, Shanghai (CN); Minghua Zhang, Shanghai (CN); Jingxun Fang, Shanghai (CN); Junhua Yan, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 1 day.

(21) Appl. No.: 14/040,736

(22) Filed: Sep. 30, 2013

(65) Prior Publication Data

US 2014/0357041 A1    Dec. 4, 2014

(30) Foreign Application Priority Data

May 31, 2013  (CN) .......................... 2013 1 0213628

(51) Int. Cl.
*H01L 21/336* (2006.01)
*H01L 29/66* (2006.01)
*H01L 21/02* (2006.01)

(52) U.S. Cl.
CPC .... *H01L 29/66795* (2013.01); *H01L 21/02428* (2013.01); *H01L 21/02532* (2013.01); *H01L 21/02587* (2013.01); *H01L 21/02658* (2013.01)
USPC ............ 438/300; 438/430; 438/576; 438/589

(58) Field of Classification Search
CPC ............ H01L 29/785; H01L 29/66795; H01L 29/7848; H01L 21/823821; H01L 21/823431; H01L 27/0886; H01L 29/41791; H01L 21/845; H01L 27/1211
USPC .................................. 438/430, 576, 589, 300
See application file for complete search history.

(56) References Cited

U.S. PATENT DOCUMENTS

| | | | | |
|---|---|---|---|---|
| 7,871,876 B2* | 1/2011 | Anderson et al. | ............. | 438/198 |
| 2011/0272739 A1* | 11/2011 | Lee et al. | ....................... | 257/192 |
| 2012/0012932 A1* | 1/2012 | Perng et al. | ................... | 257/347 |
| 2012/0091528 A1* | 4/2012 | Chang et al. | ................... | 257/347 |
| 2013/0099282 A1* | 4/2013 | Chen et al. | .................... | 257/190 |
| 2013/0256764 A1* | 10/2013 | Liaw | .............................. | 257/288 |
| 2013/0270628 A1* | 10/2013 | Huang et al. | .................. | 257/329 |
| 2014/0131812 A1* | 5/2014 | Wu et al. | ........................ | 257/401 |
| 2014/0145242 A1* | 5/2014 | Huang et al. | .................. | 257/192 |
| 2014/0327091 A1* | 11/2014 | LIN et al. | ...................... | 257/401 |

* cited by examiner

Primary Examiner — Bac Au

(57) ABSTRACT

A method of forming strained source and drain regions in a P-type FinFET structure is disclose. The method comprises depositing an isolation layer on the FinFET structure; applying a lithography and etching process to expose the isolation layer in two areas on opposite sides of the gate over the source/drain region of the FinFET, and etching through the exposed isolation layer to expose the semiconductive material of the source/drain region in the two areas; forming a recess in each of the source/drain region from the exposed semiconductive material; selectively epitaxially growing another semiconductive material in the recesses to increase the source/drain strain; and removing the rest of the isolation layer.

9 Claims, 2 Drawing Sheets

METHOD OF FORMING STRAINED SOURCE AND DRAIN REGIONS IN A P-TYPE FINFET STRUCTURE

CROSS-REFERENCE TO RELATED APPLICATION

This application claims the priority benefit of China application serial no. 201310213628.5, filed May 31, 2013. All disclosure of the China application is incorporated herein by reference.

FIELD OF THE INVENTION

The present invention relates to the field of semiconductor fabrication technology and particularly to a method of forming strained source and drain regions in a P-type finFET structure.

BACKGROUND OF THE INVENTION

With the development of the semiconductor technology, fin field effect transistors (FETs) represent new CMOS devices for improving FET performance. The gate of a conventional planar transistor is located over the channel on one side, while the gate of a FinFET surrounds the channel from two sides, thus electrostatic control may be implemented for the channel from two sides. By such design, the FinFET can improve the control over the channel, reduce short-channel effect, and reduce the gate length effectively. However, compared to the embedded silicon germanium (e-SiGe) PMOS process for increasing the carrier mobility of the PMOS device, it is much more difficult to form stressors in source/drain region of a p-type FinFET since the conventional method may cause the deformation of the FinFET structure and the nonuniformity of the stressors in source/drain region.

To be specific, a conventional method of forming stressors, such as SiGe, in source/drain region of a p-type FinFET comprises the following steps: coating a photoresist layer on the FinFET structures; removing the photoresist on the p-type FinFET by exposure and development; etching and epitaxially growing SiGe in the p-type FinFET source/drain region. Although simple, such method may lead to the structural deformation of the FinFET. Moreover, in the known method, the SiGe does not grow uniformly by epitaxial growth and the scope of the embedded SiGe is difficult to control.

SUMMARY OF THE INVENTION

Accordingly, at least one object of the present invention is to provide a method of forming strained source and drain regions of a P-type a FinFET structure having uniform stressors and well controlled scope.

To achieve these and other advantages and in accordance with the objective of the invention, as embodied and broadly described herein, the invention provides a method of forming strained source and drain regions in a P-type FinFET structure comprising the following steps:

step S01, depositing an isolation layer on the P-type FinFET structure, the P-type FinFET structure comprises a gate and a fin having a channel region and source and drain regions extending from the channel region, wherein the source and drain regions are filled with a first semiconductive material;

step S02, applying a lithography and etching process to expose the isolation layer in two areas on opposite sides of the gate over the source and drain regions, and then etching through the exposed isolation layer to expose the first semiconductive material in the two areas;

step S03 forming a recess in each of the source and drain regions by etching from the exposed first semiconductor material;

step S04, selectively epitaxially growing a second semiconductive material in the recesses, wherein the second semiconductive material has a larger lattice constant than the first semiconductive material;

step S05, removing the rest of the isolation layer.

Furthermore, the recess has a U-shaped profile.

Furthermore, the U-shaped profile is formed by dry etching.

Furthermore, the recess has a Sigma-shaped profile.

Furthermore, the Sigma-shaped profile is formed by wet etching.

Furthermore, the maximum width of the recess is smaller than that of the fin.

Furthermore, the first semiconductive material comprises single crystalline silicon; the second semiconductive material comprises SiGe or doped SiGe.

Furthermore, the isolation layer is SiN.

Furthermore, the exposed isolation layer is etched through by dry etching in the step S02.

Furthermore, the rest of the isolation layer is removed by wet etching in the step S05.

The method of forming strained source and drain regions in a P-type FinFET structure in the present invention can effectively enhance the carrier mobility in the channel region and reduce the current leakage without affecting the structure of the FinFET. Additionally, the uniformity of the embedded stressors increases and the scope of the stressors are more controllable.

BRIEF DESCRIPTION OF THE DRAWINGS

The accompanying drawings are included to provide a further understanding of the advantages and principles of the invention, in which.

DETAILED DESCRIPTION OF THE EMBODIMENTS

Figure 1:
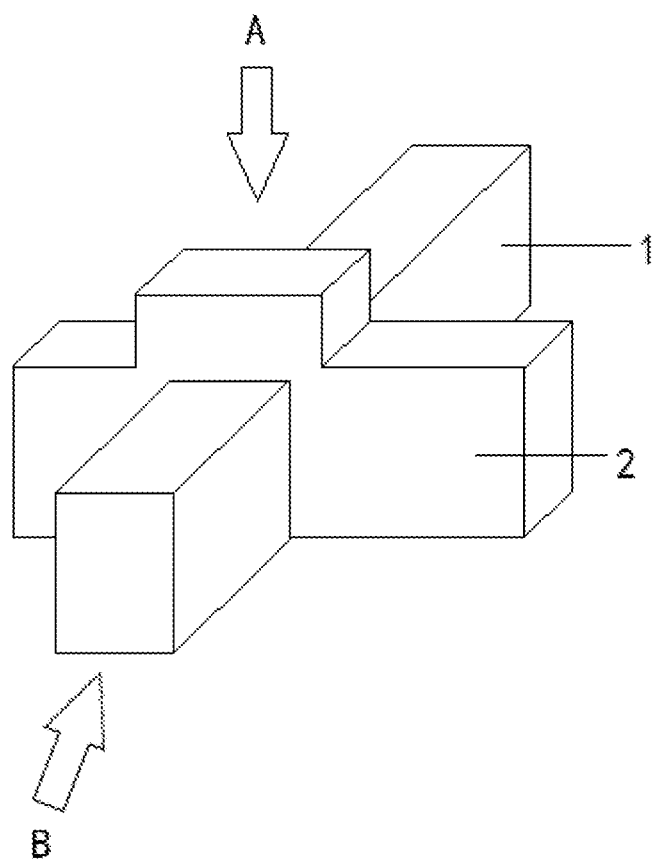
FIG. 1 illustrates a schematic of the P-type FinFET having no strained source and drain regions in an embodiment of the present invention.

The method of forming strained source and drain regions in a P-type FinFET of the present invention will be described in further details hereinafter with respect to the embodiments and the accompanying drawings.

The present invention is described with reference to the attached figures, wherein like reference numerals are used throughout the figures to designate similar or equivalent elements. The figures are not drawn to scale and they are provided merely to illustrate the invention.

Referring to FIG. 1, the P-type FinFET structure comprises a gate 2 and a fin 1 having a channel region and source and drain regions extending from the channel region. The fin comprises a first semiconductive material. In the embodiment, the first semiconductive material is single crystalline silicon, and thus the source and drain regions are both filled with the single crystalline silicon material. The gate comprises mono-crystalline silicon.

Figure 2A:
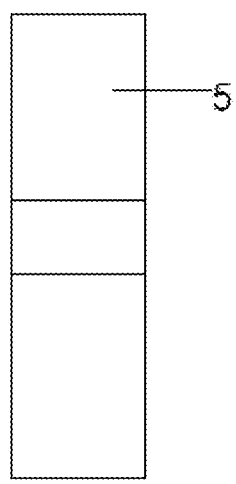
FIG. 2A to FIG. 2C illustrate top views showing the process of forming strained source and drain regions in the P-type FinFET in an embodiment of the present invention.
Figure 2B:
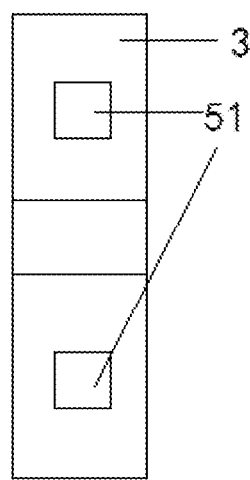
Figure 2C:
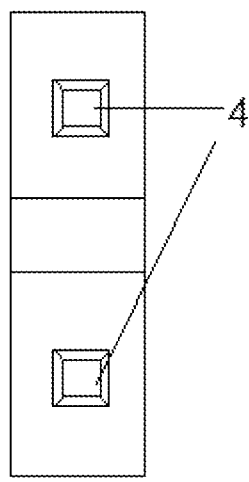
Figure 3:
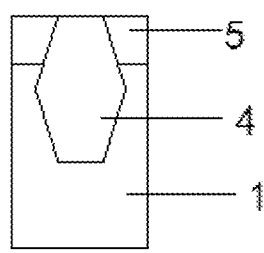
FIG. 3 illustrates a cross-section of the fin of the P-type FinFET having strained source and drain regions in an embodiment of the present invention.

Referring to FIG. 2a to FIG. 2c, which illustrate the partial top views of the P-type FinFET in FIG. 1 from direction A, the method of forming strained source and drain regions in the P-type FinFET comprises the following steps:

In step S01, an isolation layer 5 is deposited on the P-type FinFET, as shown in FIG. 2a. In the embodiment, the isolation layer can be SiN.

In step 102, a lithography and etching process is applied to expose the isolation layer 5 in two areas on opposite sides of the gate 2 over the source and drain regions, wherein the two areas are defined by the lithography pattern. To be specific, firstly a photoresist 3 is coated on the isolation, then a exposure and development process is applied, and the isolation layer 51 is exposed. Afterwards, the exposed isolation layer 51 is etched though to expose the first semiconductive material of the source and drain regions within the two areas as shown in FIG. 2b. The other parts of the source and drain regions are still covered by the isolation layer to prevent etching erosion.

In step S03, a recess 4 is formed in each of the source and drain regions by etching from the exposed first semiconductor material, as shown in FIG. 2c. Wherein, the maximum width of the recess 4 should be smaller than that of the fin 1 to ensure the first semiconductive material wrap around the sidewall surface of the recess 4. In the conventional manufacturing processes, the whole source and drain regions are exposed to be etched and the etching degree differs in different surfaces of the source and drain regions (the top surface of the source and drain regions is etched most), which affects the etching uniformity. While in the present invention, only the first semiconductive material in the two areas are etched and other parts of the source and drain regions are covered by the isolation layer, therefore the etching uniformity can be increased and the stressors can be grown evenly in the subsequent step.

Referring to FIG. 2d, which is a cross-section of the fin 1 from direction B, the recess 4 has a Sigma-shaped profile. The Sigma-shaped profile can be formed by wet etching. In other embodiments, the recess 4 can have a U-shaped profile which is formed by dry etching. By forming the recess to have a U-shaped or Sigma-shaped profile, it becomes possible with the present invention to enhance the effect of stress application.

In step S04, a second semiconductive material is deposited in the recess 4 by selectively epitaxially growth. The second semiconductive materials has a larger lattice constant than the first semiconductive material and increases the stress in the source and drain regions, thus to increase the carrier mobility and enhance the device performance. In the embodiment, the second semiconductive material can be SiGe or doped SiGe. Furthermore, since the openings of the recesses are formed within the two areas defined by the lithography pattern, the scope of the strained source and drain regions can be controlled.

In step S05, the rest of the isolation layer 5 is removed through wet etching or other well-known methods.

It should be understood that well-known specific processes such as the deposition, the lithography and etching process, the wet/dry etching process, the epitaxial growth etc, which are not shown in detail, can all refer to the conventional processes.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of forming strained source and drain regions in a P-type FinFET structure comprising the following steps:

Step S01, depositing an isolation layer on the P-type FinFET structure, the P-type FinFET structure comprises a gate and a fin having a channel region and source and drain regions extending from the channel region, wherein the source and drain regions are filled with a first semi-conductive material;

Step S02, applying a lithography and etching process to expose the isolation layer in two areas on opposite sides of the gate over the source and drain regions, and then etching through the exposed isolation layer to expose the first semi-conductive material in the two areas;

Step S03, forming a recess in each of the source and drain regions by etching from the exposed first semiconductor material, wherein the maximum width of the recess is smaller than that of the fin, and the sidewall surface of the recess is wrapped around by the first semi-conductive material;

Step S04, selectively epitaxial growing a second semi-conductive material in the recesses, wherein the second semi-conductive material has a larger lattice constant than the first semi-conductive material;

Step S05, removing the rest of the isolation layer.

2. The method of forming strained source and drain regions in a P-type FinFET structure according to claim 1, wherein the recess has a U-shaped profile.

3. The method of forming strained source and drain regions in a P-type FinFET structure according to claim 2, wherein the U-shaped profile is formed by dry etching.

4. The method of forming strained source and drain regions in a P-type FinFET structure according to claim 3, wherein the recess has a Sigma-shaped profile.

5. The method of forming strained source and drain regions in a P-type FinFET structure according to claim 4, wherein the Sigma-shaped profile is formed by wet etching.

6. The method of forming strained source and drain regions in a P-type FinFET structure according to claim 1, the first semi-conductive material comprises single crystalline silicon; the second semi-conductive material comprises SiGe or doped SiGe.

7. The method of forming strained source and drain regions in a P-type FinFET structure according to claim 1, wherein the material of the isolation layer is SiN.

8. The method of forming strained source and drain regions in a P-type FinFET structure according to claim 1, wherein the exposed isolation layer is etched through by dry etching in the step S02.

9. The method of forming strained source and drain regions in a P-type FinFET structure according to claim 1, wherein the rest of the isolation layer is removed by wet etching in the step S05.

* * * * *